(12) United States Patent
Creighton et al.

(10) Patent No.: US 6,923,681 B1
(45) Date of Patent: Aug. 2, 2005

(54) ELECTRICAL ASSEMBLY FOR SOLDERLESS INTERCONNECTION OF CIRCUIT BOARDS IN A STACKED CONFIGURATION

(75) Inventors: David M. Creighton, Hacienda Hghts, CA (US); Earnest Y. Masumoto, San Pedro, CA (US)

(73) Assignee: Raytheon Company, Waltham, MA (US)

( * ) Notice: Subject to any disclaimer, the term of this patent is extended or adjusted under 35 U.S.C. 154(b) by 0 days.

(21) Appl. No.: 09/083,298

(22) Filed: May 22, 1998

(51) Int. Cl.$^7$ .......................................... H01R 13/73
(52) U.S. Cl. ......................... 439/607; 439/74; 29/832; 29/861; 29/747
(58) Field of Search .......................... 29/739, 830, 831, 29/832, 837, 840, 842, 834, 860; 361/386, 361/388, 389, 736; 439/74, 79, 108, 701, 439/247, 634; 228/180.21, 159

(56) References Cited

U.S. PATENT DOCUMENTS

| | | | | |
|---|---|---|---|---|
| 4,575,167 A | * | 3/1986 | Minter | 439/83 |
| 4,693,408 A | * | 9/1987 | Dines et al. | 228/47 |
| 5,013,255 A | * | 5/1991 | Juret et al. | 439/260 |
| 5,093,987 A | * | 3/1992 | Scholz | 29/860 |
| 5,099,396 A | * | 3/1992 | Barz et al. | 361/424 |
| 5,259,769 A | * | 11/1993 | Cruise et al. | 439/65 |
| 5,353,201 A | * | 10/1994 | Maeda | 361/816 |
| 5,378,160 A | * | 1/1995 | Yumibe et al. | 439/66 |
| 5,383,098 A | * | 1/1995 | Ma et al. | 361/818 |
| 5,528,462 A | * | 6/1996 | Pendse | 361/767 |
| 5,778,526 A | * | 7/1998 | Vinciarelli et al. | 29/840 |
| 5,812,374 A | * | 9/1998 | Shuff | 361/704 |
| 5,904,581 A | * | 5/1999 | Pope et al. | 439/74 |
| 5,905,382 A | * | 5/1999 | Wood et al. | 324/758 |
| 5,971,806 A | * | 10/1999 | Evans et al. | 439/632 |
| 6,625,881 B2 | * | 9/2003 | Ammar et al. | 29/832 |

OTHER PUBLICATIONS

IBM technical disclosure bulletin, Aug. 1965.*

* cited by examiner

Primary Examiner—Minh Trinh
(74) Attorney, Agent, or Firm—John E. Gunther; Karl A. Vick

(57) ABSTRACT

An assembly for providing electrical connection between first and second substrates aligned in a stacked configuration. The inventive assembly includes a conductor assembly having at least one elongate conductor adapted to engage a first electrical contact on the first substrate on one end and a second electrical contact on the second substrate on a second end thereof. The conductor is adapted to provide a spring force. The assembly further includes a mechanism for retaining the conductor in abutting contact with at least one of the first or second contacts and thereby effect an electrical connection between the first contact on the first substrate and the second contact on the second substrate.

8 Claims, 5 Drawing Sheets

ELECTRICAL ASSEMBLY FOR SOLDERLESS INTERCONNECTION OF CIRCUIT BOARDS IN A STACKED CONFIGURATION

BACKGROUND OF THE INVENTION

1. Field of the Invention

The present invention relates to electronic circuitry. More specifically, the present invention relates to systems and methods for interconnecting circuit boards in a stack configuration.

2. Description of the Related Art

For certain applications, there is a need to provide high-density packaging of electronic circuitry in a small area. This need is often addressed by stacking multiple circuit boards. Signal transfer between boards is effected through z-axis linkage. 'Z-axis linkage' typically includes conductors embedded in a dielectric medium, restrained wire ("fuzz buttons"), and various contact schemes using flex cables including dimples, grooves and gold dots. Unfortunately, all of these schemes have limited applicability, some because of relatively high contact resistance and some because of the high pressure required to assure contact.

The prior art approaches generally require tight vertical spacing and tolerances which limit their application to highly controlled substrate flatness and via or target height control. In addition, the assembly of these connectors for static applications involves pressing the contact on the via or target without any wiping action which, in the case of any contamination on either surface or slight misalignment, can increase the contact resistance or, under worst case conditions, prevent an electrical connection.

Hence, there is a need in the art for a system and method for providing highly reliable, low cost z-axis interconnect between substrates in a three-dimensional stack of circuit boards.

SUMMARY OF THE INVENTION

The need in the art is addressed by the present invention which provides an assembly for providing electrical connection between first and second substrates aligned in a stacked configuration. The inventive assembly includes a conductor assembly having at least one elongate conductor adapted to engage a first electrical contact on the first substrate on one end and a second electrical contact on the second substrate on a second end thereof. The conductor is adapted to provide a spring force. The assembly further includes a mechanism for retaining the conductor in abutting contact with at least one of the first or second contacts and thereby effect an electrical connection between the first contact on the first substrate and the second contact on the second substrate.

Hence, the invention provides a means of transmitting electrical signals from one substrate to another (in the z-axis) in a three-dimensional stack. Signals are transmitted by way of a formed cable with integral spring contacts (called a z-axis interconnect, or simply, interconnect) from one substrate to another. Electrical connection is made between vias on the substrate and the spring contacts of the cable. A novel feature is the cable with integral spring contacts made of beryllium copper or other metal appropriate for a given application. An additional novel feature is the incorporation of a thermal path between the top and bottom substrates.

The invention addresses the shortcomings of the previous methods. The design of the spring contacts allows for wide vertical spacing tolerances. It also provides a wiping action during assembly. Because of the spring contact design, the force required to maintain good mechanical contact is low. In addition to these features, this interconnect method allows for multiple, high density (<0.025") contacts with low contact resistance, high reliability, ease of manufacture, and low cost. This z-axis interconnect scheme allows for ease of stack repair, since the cable contacts can be replaced each time the assembly is repaired, if necessary. When coupled with a thermally conductive support plate in contact with the upper and lower substrates, efficient transfer of heat may be effected.

The inventive design is effective in both hermetic and nonhermetic applications. Unlike prior approaches, which depend on close vertical tolerances in the mating substrates, this method is forgiving of uneven substrate contact surfaces. The inventive design may be used on straight or curved contact configurations, and in both static and some dynamic applications. When used with a thermally conductive vertical support, an additional advantage of efficient heat dissipation may be realized.

DESCRIPTION OF THE INVENTION

Illustrative embodiments and exemplary applications will now be described with reference to the accompanying drawings to disclose the advantageous teachings of the present invention.

While the present invention is described herein with reference to illustrative embodiments for particular applications, it should be understood that the invention is not limited thereto. Those having ordinary skill in the art and access to the teachings provided herein will recognize additional modifications, applications, and embodiments within the scope thereof and additional fields in which the present invention would be of significant utility.

Figure 1:
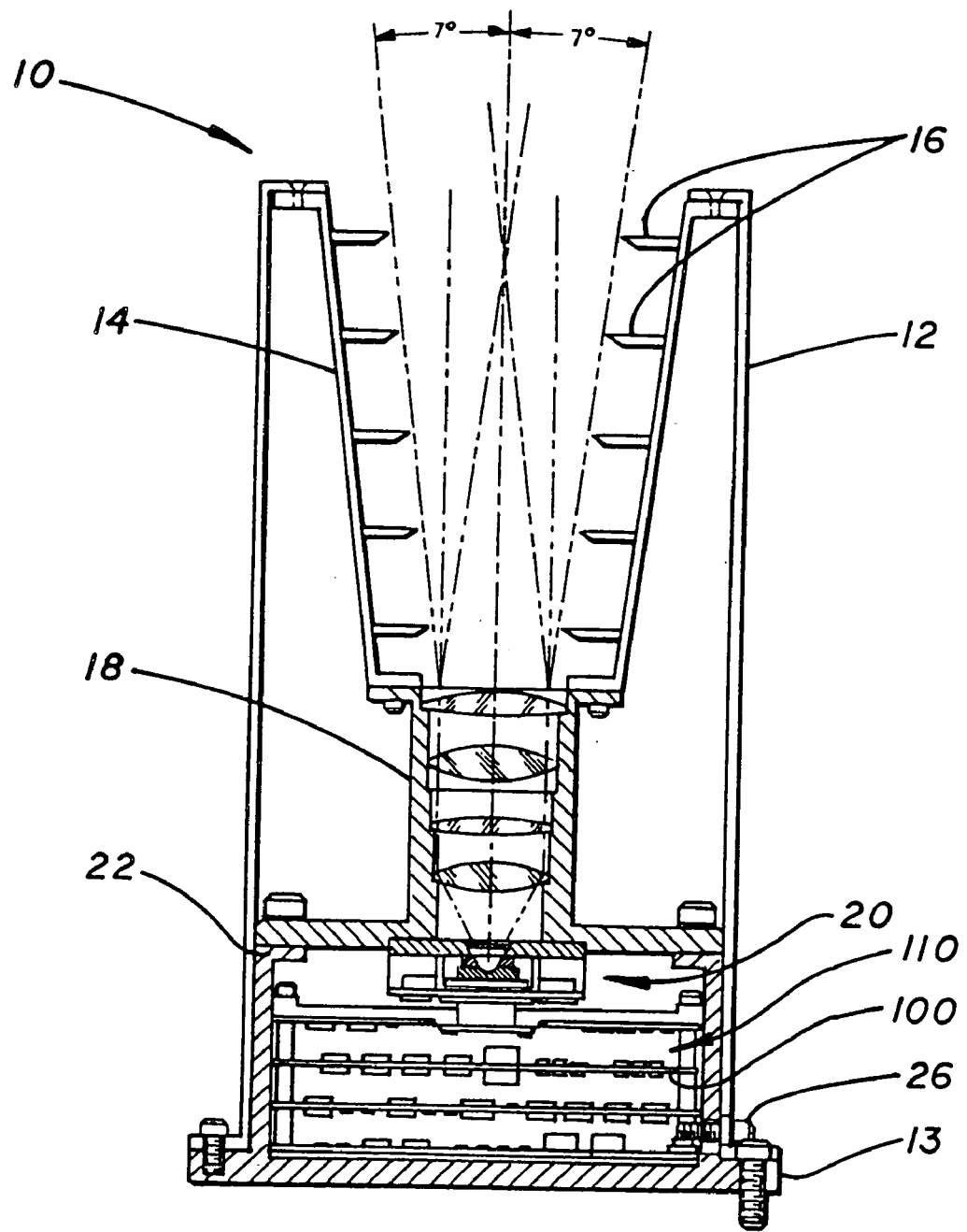
FIG. 1 is a diagram of a stellar sensor unit incorporating the electrical assembly of the present invention.

FIG. 1 is a diagram of a stellar sensor unit 10 incorporating the electrical assembly 100 of the present invention. Those skilled in the art will appreciate that the application of FIG. 1 is illustrative of the utility of the present invention.

The teachings of the present invention may be utilized in numerous diverse applications without departing from the scope thereof.

As illustrated in FIG. 1, the stellar sensor unit 10 includes a reflective shroud 12 which is secured on a base 13. A sun shield 14 is disposed within the shroud 12. The sun shield 14 has a plurality of light baffles 16. The sun shield 14 directs light to a refractive telescope 18. The telescope 18 focuses light onto a detector assembly 20. The detector assembly 20 converts the light received from the telescope 18 into electrical energy and outputs signals to an electronic assembly 100 disclosed more fully below. The assembly 100 includes plural circuit boards which are interconnected by a global interconnect 110 of the present invention.

As discussed more fully below, the global interconnect 110 provides a means of transmitting electrical signals from one substrate to another (in the z-axis) in a three-dimensional stack. Signals are transmitted by way of a formed cable with integral spring contacts (called a z-axis interconnect, or simply, interconnect) from one substrate to another. Electrical connection is made between vias on the substrate and the spring contacts of the cable.

The assembly 100 is secured within the unit 10 by a printed wiring board clamp 22. Electrical signals are input to and output from the assembly 100 by an input/output (I/O) connector 26.

Figure 2:
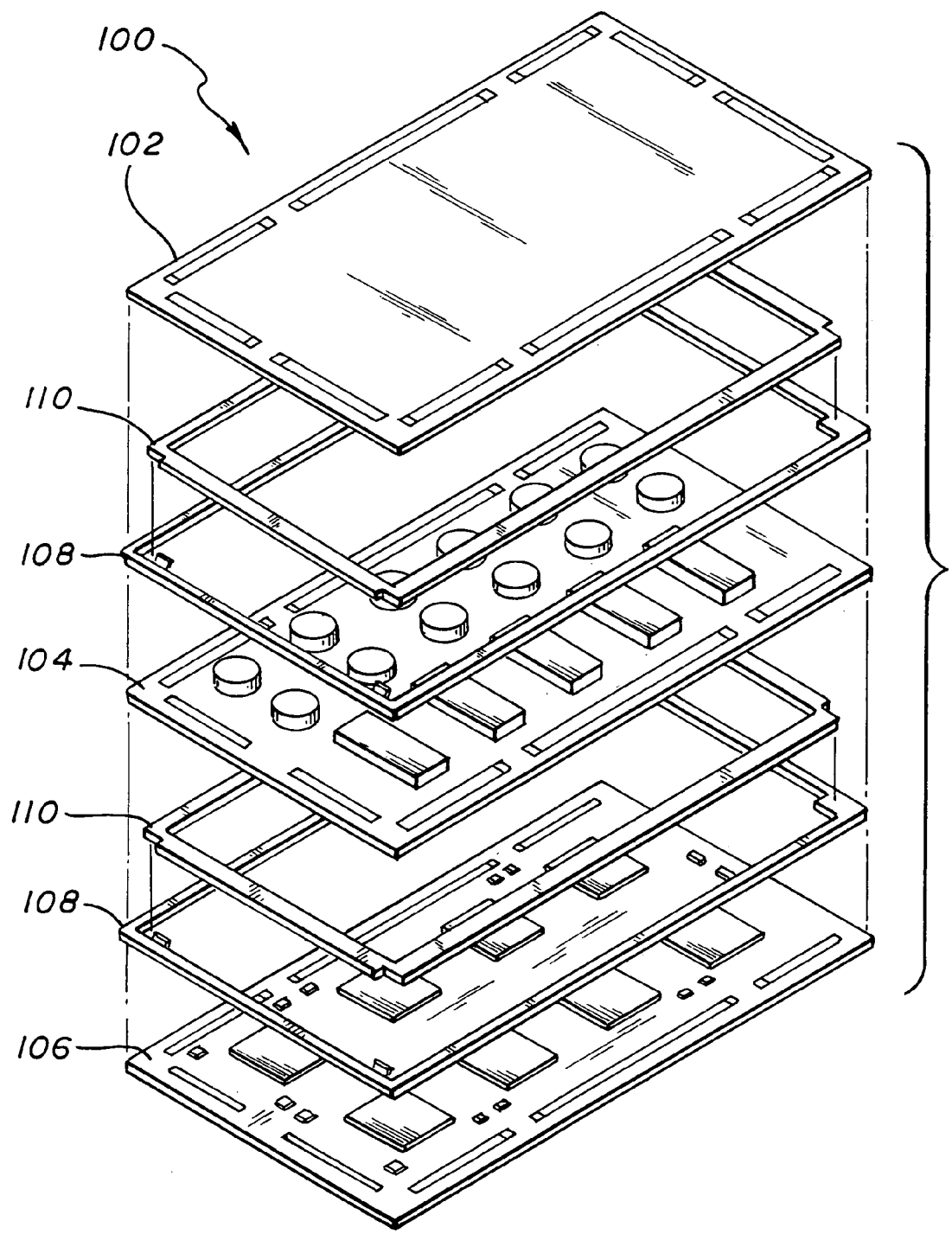
FIG. 2 is a diagram of a multilayer assembly incorporating the teachings of the present invention.

FIG. 2 is a diagram of the multilayer assembly of FIG. 1 incorporating the teachings of the present invention. The assembly 100 includes first, second and third circuit boards 102, 104 and 106. Each circuit board has a substrate 103 (shown in FIG. 5) of any appropriate configuration, on which a plurality of electrical components are interconnected with wires or metallization as will be appreciated by those skilled in the art. The substrate 103 may be a printed wiring board (PWB), ceramic or other suitable material. In accordance with the present teachings, between each set of circuit boards is a frame 108 and the global interconnect 110.

Figure 3:
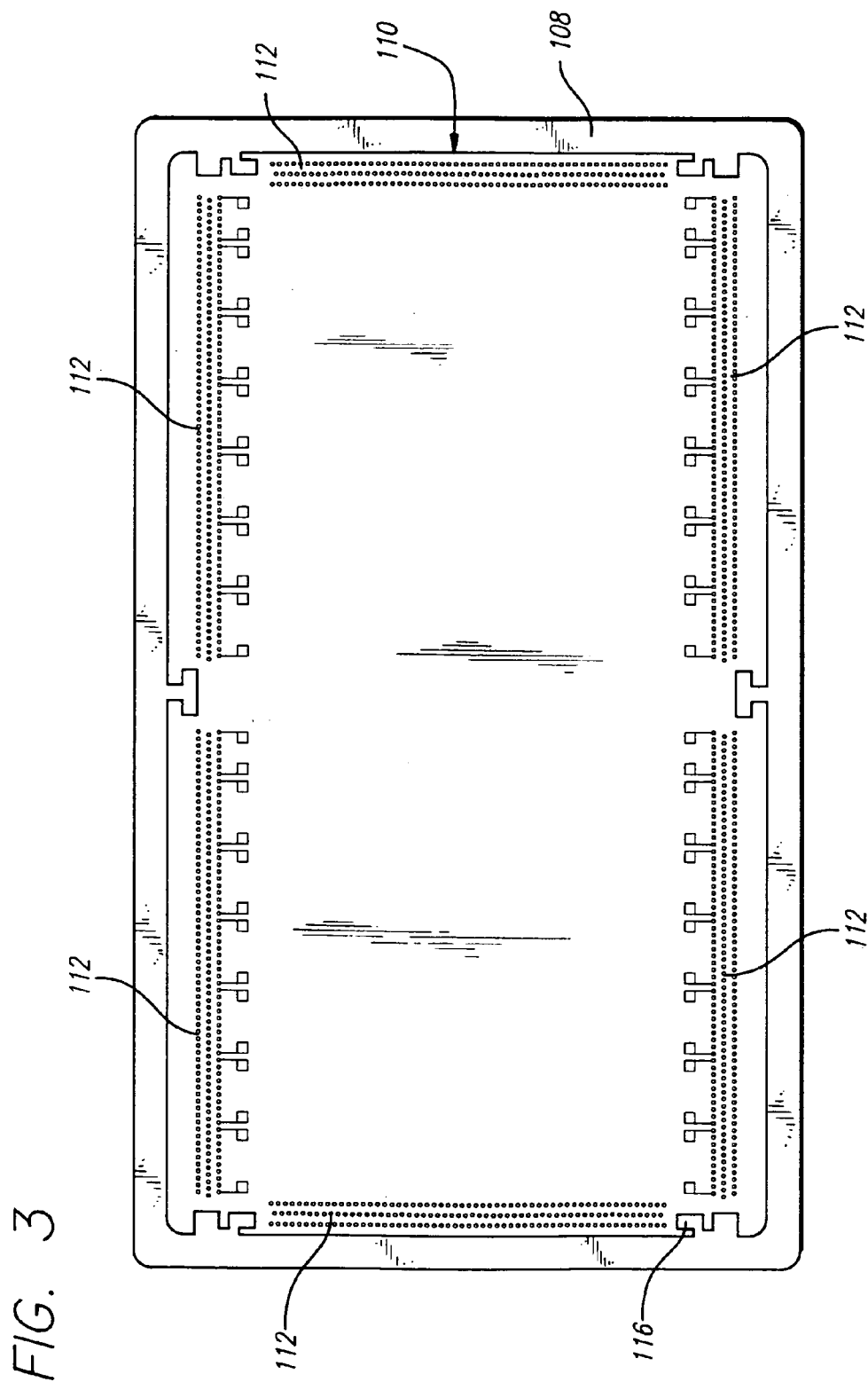
FIG. 3 is a top view of the frame and the global interconnect of the multilayer assembly incorporating the teachings of the present invention.

FIG. 3 is a top view of the frame 108 and the global interconnect 110. As shown in FIG. 3, the global interconnect 110 includes six individual housings 112.

Figure 4:
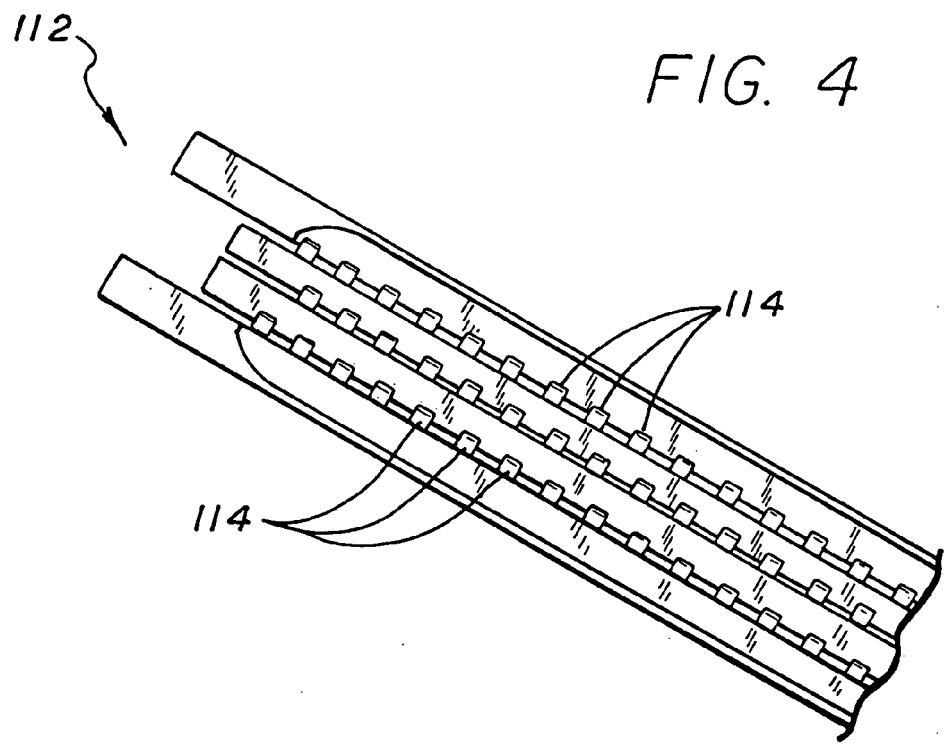
FIG. 4 is a top view of a single housing of the global interconnect of the multilayer assembly incorporating the teachings of the present invention
Figure 5:
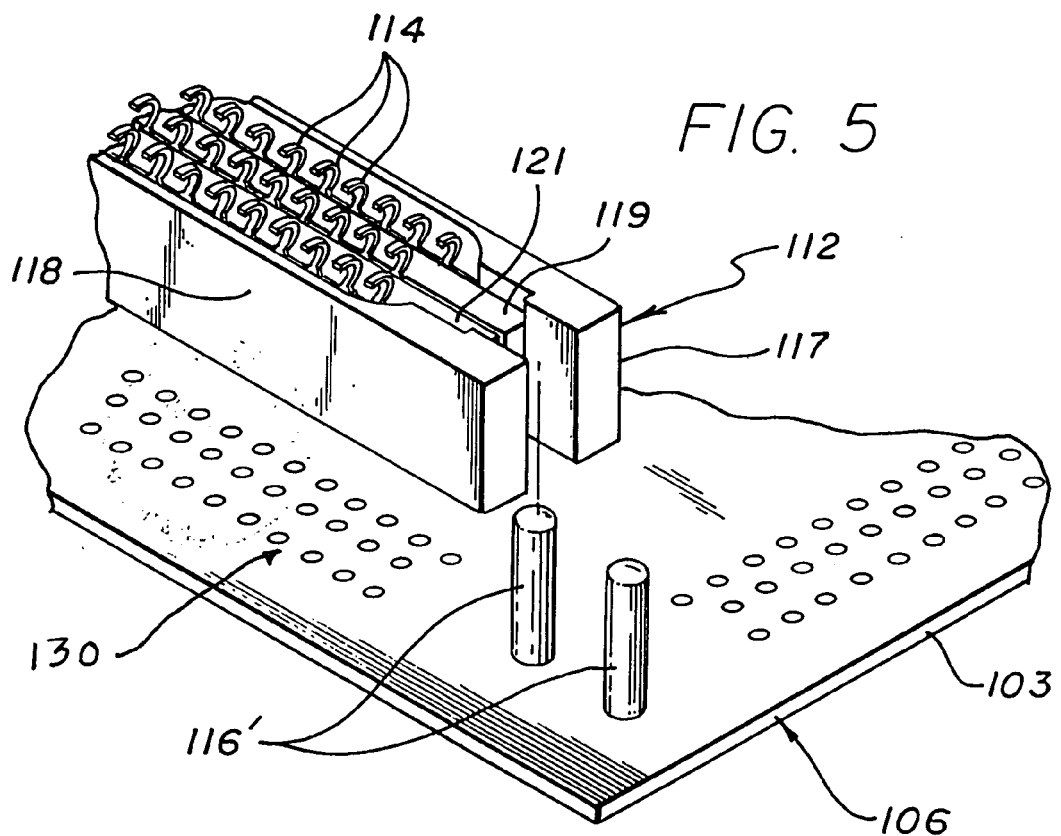
FIG. 5 is a magnified perspective view of a single housing of the global interconnect of the multilayer assembly incorporating the teachings of the present invention.

FIG. 4 is a top view of a single housing 112. As shown in FIG. 4, within each housing 112, an array of conductors 114 is disposed. FIG. 5 is a magnified perspective view of a housing 112 showing the conductors 114. In FIG. 5, an alternative mounting arrangement is depicted in which locating pins 116' are mounted on a substrate of a circuit board 106. Note the array of contacts 130 on the substrate. Whether locating pins 116' are used or a protrusion 116 in the frame 108, each housing 112 includes first and second outer walls 117 and 118 and first and second inner walls 119 and 121. The inner and outer walls are made of plastic or other suitable dielectric material.

Figure 6:
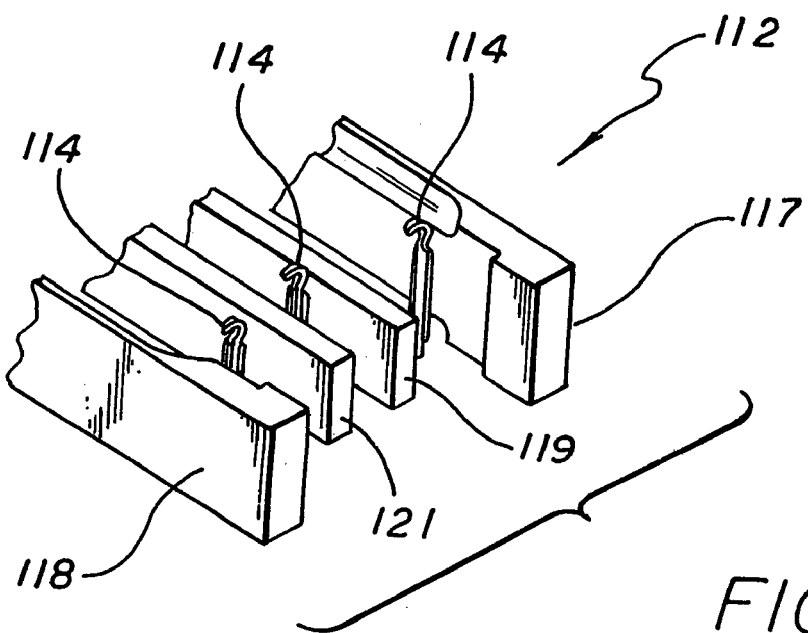
FIG. 6 is a magnified end view of a single housing of the global interconnect of the multilayer assembly incorporating the teachings of the present invention.

FIG. 6 is a magnified view of an end of a housing 112. As shown in FIG. 6, the conductors 114 are sandwiched between the inner walls and the outer walls of the housing 112.

Figure 7:
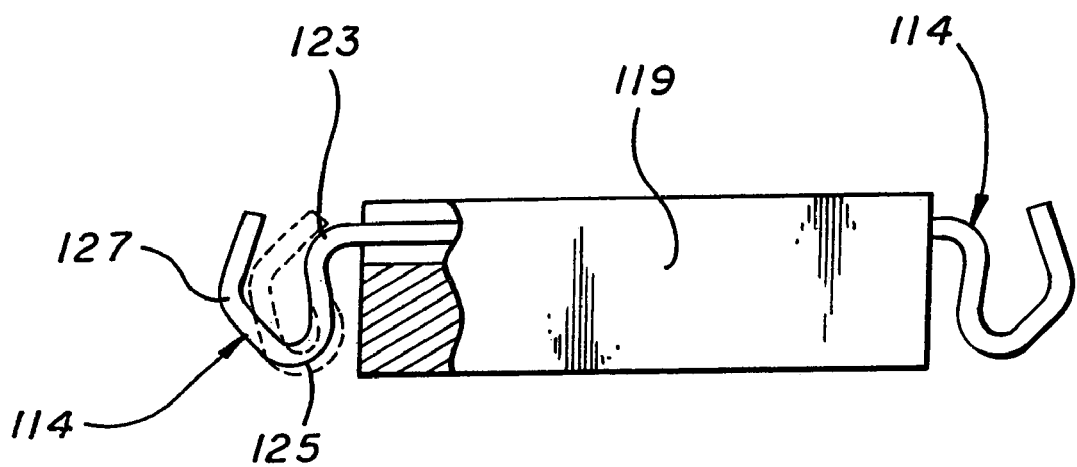
FIG. 7 is a magnified view, partially in section, of an inner wall showing first and second ends of a conductor of a single housing of the global interconnect of the multilayer assembly incorporating the teachings of the present invention.

FIG. 7 is a magnified view, partially in section, of an inner wall showing first and second ends of a conductor 114. The conductors 114 may be constructed of an appropriate spring material, such as beryllium copper. The exposed spring material of the conductors 114 may be plated with gold depending on the material used and the application. As shown in FIG. 7, at each end, each conductor has three bends 123, 125, and 127. The first bend 123 is an approximately 90° bend. The second bend 125 is approximately 45° bend. The third bend is approximately 15° bend. These bends allow the conductor 114 to provide a spring force and deflect from the first position shown in FIG. 7 to a second position shown in phantom. The third bend 127 provides a point of contact at which the conductor 114 engages a contact 130 on a circuit board. (See FIG. 5.)

Each contact 130 is a metal filled via which extends through the substrate of the board allowing signals to travel vertically through the entire assembly. The vias may be coated with a noble metal, such as gold, to provide a low resistance contact surface. One of the main features of the invention is the ability, due to the spring force, to mate with vias, not all of which may be flush with the surface of the substrate.

Returning to FIG. 2, the resulting assembly is placed in a suitable restraining guide and the lower and upper substrates are assembled. The resulting compression of the spring contacts causes a wiping action across the substrate contact surface, removing any accumulated contamination, and assuring a superior connection. The restraining guide disclosed herein is one of many schemes which could be used. The guide may be made of a good thermal conductor, such as aluminum coated with a dielectric (anodized). The guide is constructed to limit the travel of the spring and to establish substrate spacing. Posts on the guide are in contact with the substrates, providing a thermal path.

Thus, the present invention has been described herein with reference to a particular embodiment for a particular application. Those having ordinary skill in the art and access to the present teachings will recognize additional modifications applications and embodiments within the scope thereof. For example, the length of the interconnect cable, the shape of the spring contacts and the angle of the formed spring may be varied to suit a specific application without departing from the scope of the present teachings.

It is therefore intended by the appended claims to cover any and all such applications, modifications and embodiments within the scope of the present invention.

Accordingly,

What is claimed is:

1. An assembly for providing solderless electrical connection between first and second substrates aligned in a stacked configuration, said assembly comprising:
   a conductor assembly having at least one elongate conductor adapted to engage a first electrical contact on said first substrate on one end and a second electrical contact on said second substrate on a second end thereof, said at least one elongate conductor having three bends which create a hook shape at both the first and second ends thereof to provide a spring force on both the first and second ends thereof and
   means for retaining said at least one elongate conductor in abutting contact with said first and second contacts and thereby effect a solderless electrical connection between said first contact on said first substrate and said second contact on said second substrate.

2. The assembly of claim 1 wherein said at least one elongate conductor is constrained by a dielectric between the ends thereof.

3. The assembly of claim 2 wherein said conductor assembly includes a plurality of conductors.

4. The assembly of claim 3 wherein said conductor assembly is retained within an elongate housing.

5. The assembly of claim 4 wherein said housing is retained within a frame.

6. The assembly of claim 5 wherein said housing is retained within said frame by at least one pin at each end thereof.

7. The assembly of claim 6 wherein said pin is retained by said frame.

8. A high density electrical assembly adapted to make solderless electrical contacts between plural circuit boards aligned in a stacked configuration, said assembly comprising:
   a conductor assembly having plural elongate conductors adapted to engage a first electrical contact on a first circuit board on one end and a second electrical contact on a second circuit board on a second end thereof, each conductor having a three-bend hook shape at both the first and second ends thereof to provide a spring force on both the first and second ends thereof and constrained by a dielectric between the ends thereof and means for retaining each conductor in abutting contact with said first and second contacts and thereby effect a solderless electrical connection between said first contact on said first substrate and said second contact on said second substrate.

* * * * *